(12) United States Patent  
Mody

(10) Patent No.: US 6,737,869 B2
(45) Date of Patent: May 18, 2004

(54) FAULT LOCATOR AND SELECTIVITY SENSOR

(75) Inventor: Hermant K. Mody, Avon, CT (US)

(73) Assignee: General Electric Company, Schenectady, NY (US)

( * ) Notice: Subject to any disclaimer, the term of this patent is extended or adjusted under 35 U.S.C. 154(b) by 74 days.

(21) Appl. No.: 09/683,472

(22) Filed: Jan. 4, 2002

(65) Prior Publication Data

US 2003/0128035 A1 Jul. 10, 2003

(51) Int. Cl.[7] .............................................. G01R 31/02
(52) U.S. Cl. ........................ 324/424; 324/419; 324/539
(58) Field of Search ................................ 324/424, 133, 324/539, 419; 361/62, 64

(56) References Cited

U.S. PATENT DOCUMENTS

| | | | | |
|---|---|---|---|---|
| 3,775,712 A | * | 11/1973 | Launt | 335/153 |
| 5,905,616 A | | 5/1999 | Lyke | 361/64 |
| 5,917,390 A | | 6/1999 | Papallo, Jr. et al. | 335/16 |
| 6,084,758 A | * | 7/2000 | Clarey et al. | 361/62 |
| 6,297,939 B1 | * | 10/2001 | Bilac et al. | 361/64 |
| 6,429,661 B1 | * | 8/2002 | Schweitzer, Jr. | 324/539 |
| 6,479,981 B2 | * | 11/2002 | Schweitzer, Jr. et al. | 324/133 |
| 2001/0033470 A1 | * | 10/2001 | Messerli et al. | 361/93.2 |

* cited by examiner

Primary Examiner—N. Le
Assistant Examiner—Walter Benson
(74) Attorney, Agent, or Firm—Cantor Colburn LLP

(57) ABSTRACT

A sensor for a power distribution system includes: a conductor; a core proximate the conductor; and a reed switch adjacent the core, the reed switch in electrical communication with an electronic trip unit. A power distribution system includes: an upstream circuit breaker including an electronic trip unit; a downstream circuit breaker in electrical communication with the upstream circuit breaker; a first sensor positioned downstream from the downstream circuit breaker, the first sensor includes: a conductor in electrical communication with the downstream circuit breaker; a core located proximate the conductor; and a reed switch adjacent the core, the reed switch in electrical communication with the electronic trip unit.

25 Claims, 3 Drawing Sheets

FAULT LOCATOR AND SELECTIVITY SENSOR

BACKGROUND OF INVENTION

Selectivity, also commonly referred to as coordination and discrimination, is the ability of a power distribution system to prevent current flow to downstream loads with protection from a downstream device (e.g., a circuit breaker) while maintaining current flow through an upstream device and other loads associated with the upstream device. A power distribution system may contain a series of circuit breakers, namely upstream breakers and downstream breakers. When circuit breakers are connected in series, it is desirable to ensure that a given fault caused by a short circuit condition will trip the circuit breaker closest to the fault. Such selectivity permits downstream circuit breakers connected in series with upstream circuit breakers to trip without also tripping any upstream breakers. In this way, current to a room in a building can be shut off without shutting off current to the entire building. However, the upstream breaker must also be able to provide adequate protection for the circuit breaker when operating standalone in a non-selective application. If an upstream device trips at too low of a current threshold, there is no selectivity with any downstream breakers. If the upstream device trips at too high of a current threshold, there might not be adequate protection for the circuit breaker or its electrical system. Further, any tripping system must also ensure protection for the circuit breaker and the system in the event of a single-phase condition, e.g. only one phase becomes overloaded. Existing selectivity systems for use with circuit breakers are expensive to implement because all the circuit breakers within the system require the use of an electronic trip unit. This increases the cost of the entire system because of the cost of each individual circuit breaker and because of the effort required in coordinating the trip units of the circuit breakers.

SUMMARY OF INVENTION

The above discussed and other drawbacks and deficiencies of the prior art are overcome or alleviated by a sensor for a power distribution system in which the sensor includes: a conductor; a core located proximate the conductor; and a reed switch adjacent the core, the reed switch in electrical communication with an electronic trip unit.

In an alternative embodiment, a power distribution system includes: an upstream circuit breaker including an electronic trip unit; a downstream circuit breaker in electrical communication with the upstream circuit breaker; a first sensor positioned downstream from the downstream circuit breaker, the first sensor includes: a conductor in electrical communication with the downstream circuit breaker; a core located proximate the conductor; and a reed switch adjacent the core, the reed switch in electrical communication with the electronic trip unit.

BRIEF DESCRIPTION OF DRAWINGS

Referring to the exemplary drawings wherein like elements are numbered alike in the several Figures.

DETAILED DESCRIPTION

Figure 1:
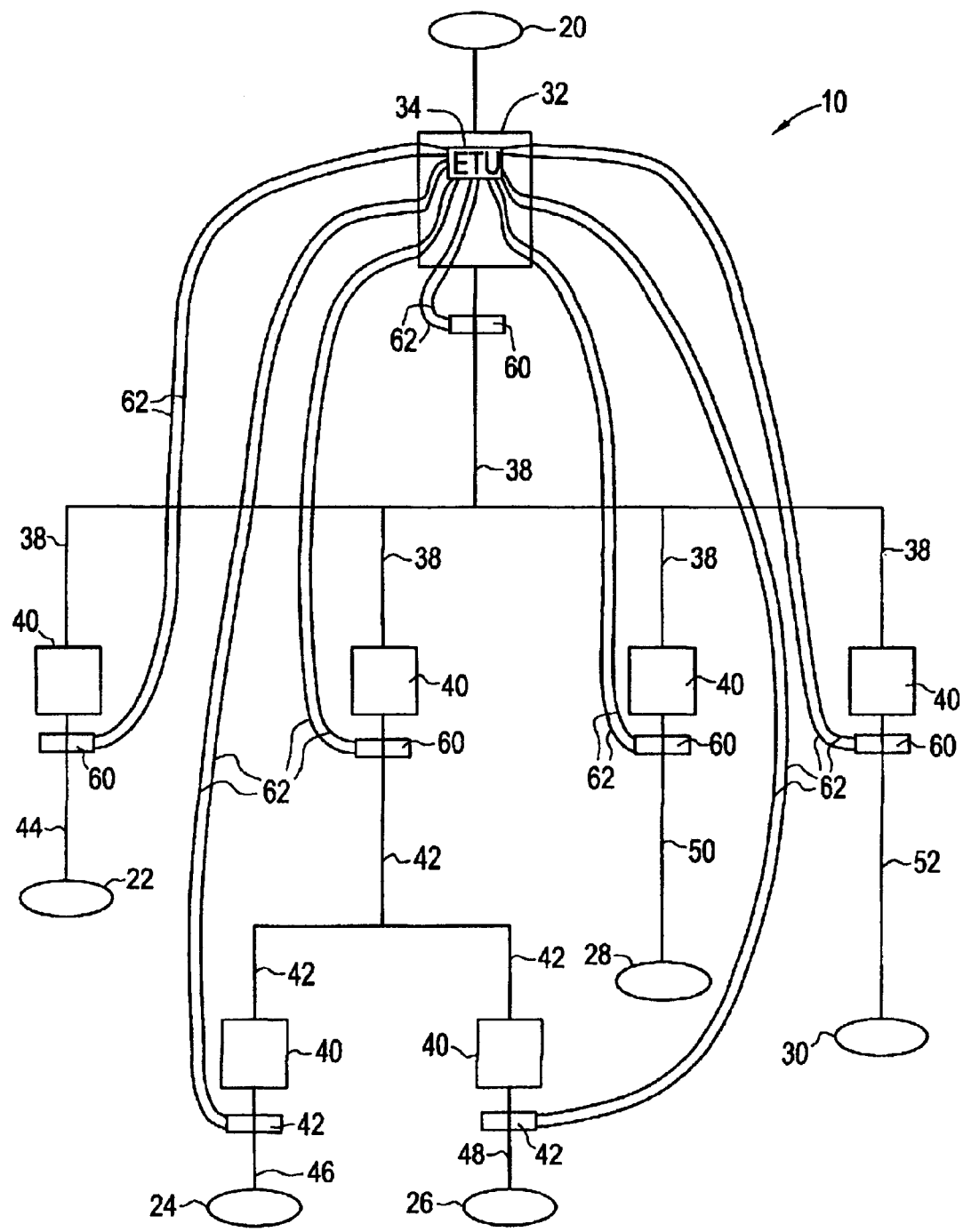
FIG. 1 is a schematic of a power distribution system.

Referring to FIG. 1, a power distribution system 10 is depicted. Power distribution system includes a power source 20 that provides electricity to various loads 22, 24, 26, 28, and 30. Power distribution system 10 also includes a circuit breaker 32, which has an electronic trip unit 34 with a microprocessor 36 (see FIG. 2). Upstream circuit breaker 32 is arranged for interrupting current to all loads 22, 24, 26, 28, and 30. In addition, upstream circuit breaker 32 is connected to a plurality of downstream circuit breakers 40 via lines 38. Downstream circuit breakers 40 may also connect to additional downstream circuit breakers 40 via lines 42. Ultimately, downstream circuit breakers 40 connect to loads 22, 24, 26, 28, and 30 via lines 44, 46, 48, 50, and 52, respectively. A sensor 60 is located downstream of each downstream circuit breaker 40, between downstream circuit breaker 40 and loads 22, 24, 26, 28, and 30. Sensor 60 is also located downstream of upstream circuit breaker 32, between upstream circuit breaker 32 and downstream circuit breakers 40. Sensors 60 communicate with upstream circuit breaker 32 via a direct cable link 62, or through a fiber optic, infrared or other communication link.

Figure 2:
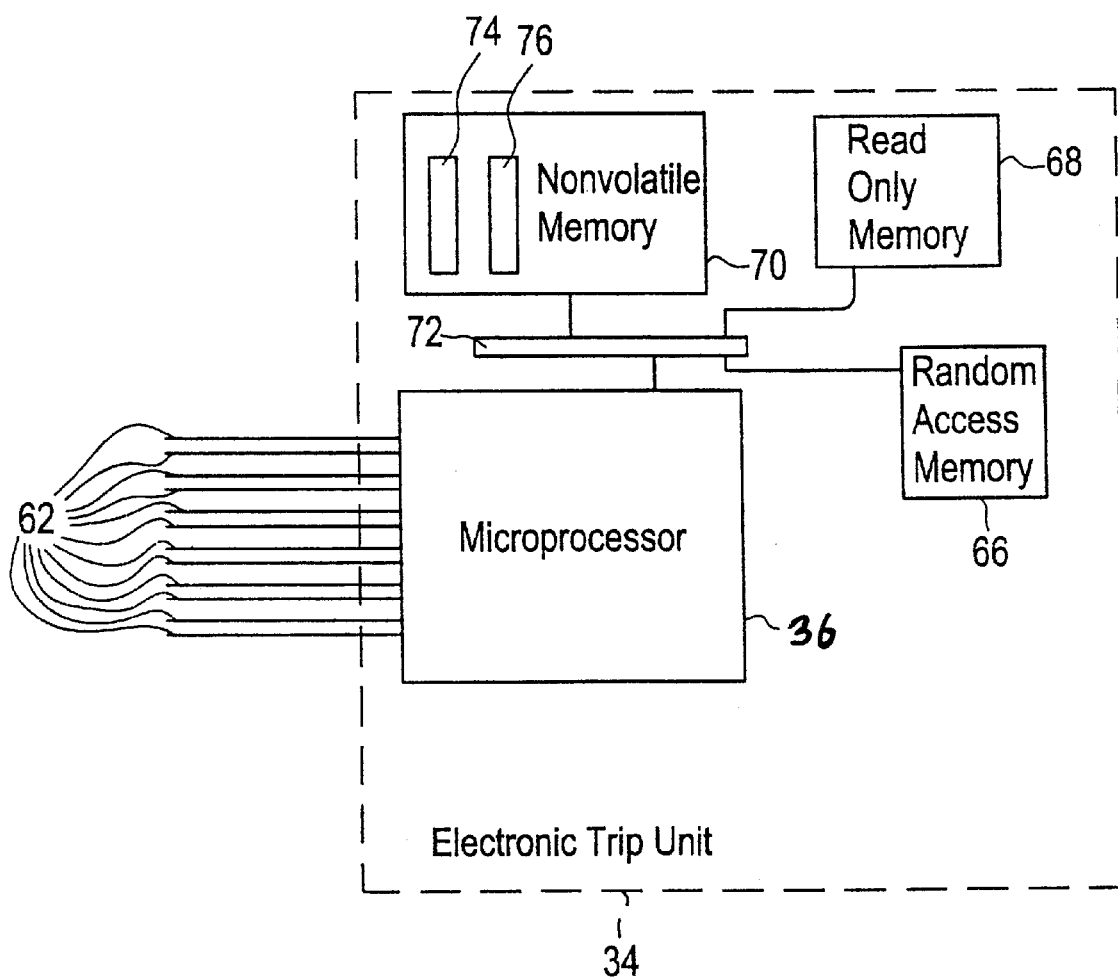
FIG. 2 is a schematic of an electronic trip unit of a circuit breaker of the power distribution system of FIG. 1.

Referring to FIG. 2, electronic trip unit 34 is illustrated in more detail. Electronic trip unit 34 includes microprocessor 36, a random access memory (RAM) 66, a read only memory (ROM) 68, and a nonvolatile memory 70. RAM 66 is coupled with microprocessor 36 via a bus 72 and is used for the temporary storage of current and voltage data and as a scratch pad memory. ROM 68 is coupled with microprocessor 36 via bus 72 and contains boot code data. Nonvolatile memory 70 is also coupled with microprocessor via bus 72 and stores multiple trip times, such as a first trip time 74 and a second trip time 76. First trip time 74 has a longer time setting than second trip time 76. The operator can set first trip time 74 and second trip time 76 to desired trip times. Microprocessor 36 controls RAM 66, ROM 68, nonvolatile memory 70, and bus 72.

Figure 3:
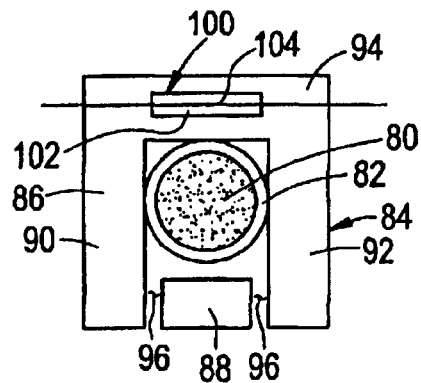
FIG. 3 is a sensor, which is located within the power distribution system of FIG. 1.

Referring to FIG. 3, sensor 60 is illustrated. Sensor 60 includes a conductor 80, with an insulation barrier 82 surrounding conductor 80. Conductor 80 is a portion of a line in power distribution circuit 10 (e.g., one phase in lines 38, 42, 44, 46, 48, 50, or 52 of FIG. 1). A core 84, which is preferably made from a ferrous material, is located proximate to conductor 80. Core 84 includes a main body portion 86 and a removable portion 88 that, together, surround conductor 80. Main body portion is generally "C" shaped, with legs 90 and 92 depending from a central portion 94. Removal of removable portion 88 provides a space formed between legs 90 and 92 to allow core 84 to be mounted on existing conductors 80 without having to weave conductor 80 through core 84. A housing (not shown) maintains main body portion 86, removable portion 88 and conductor 80 in correct assembled relationship. Two gaps 96 are formed between removable portion 88 and legs 90 and 92. By controlling the size of gaps 96, the flux density in core 84 induced by conductor 80 can be varied. Accordingly, core 84 can be adjusted such that it becomes saturated at a given current through conductor 80. A reed switch 100 is placed along central portion 94 of core 84. Reed switch 100 includes an end 102 and an end 104. When reed switch 100 is in an open position (or an off position), end 102 and end 104 are not in contact with one another preventing the flow of current through reed switch. When reed switch 100 in a closed position (or an on position), end 102 and end 104 are in contact with one another allowing the flow of current through reed switch 100.

Figure 4:
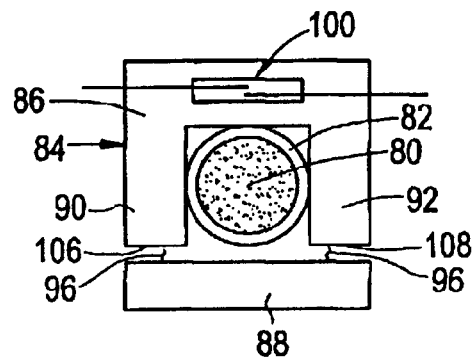
FIG. 4 is a second embodiment of a sensor, which is located within the power distribution system of FIG. 1.

Referring to FIG. 4, a second embodiment of sensor 60 is illustrated. In this embodiment, removable portion 88 of core 84 is positioned proximate end surfaces 106 and 108 of legs 90 and 92, respectively, such that gaps 96 are formed between end surfaces 106 and 108 and removable portion 88. This embodiment allows gaps 96 to be increased or decreased simply by moving removable portion 88 away from or closer to end surfaces 106 and 108. As described with reference to FIG. 3, by adjusting removable portion 88 in this manner, the flux density in core 84 can be adjusted and the point at which core 84 becomes saturated can be adjusted.

Figure 5:
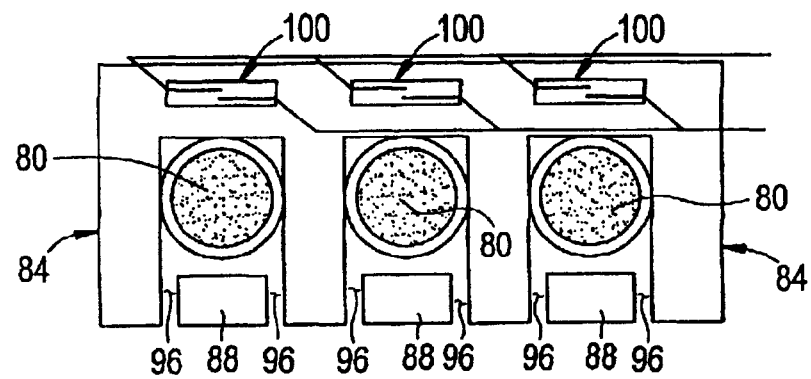
FIG. 5 is the sensor of FIG. 3 located on a three-phase circuit.

FIG. 5 shows an embodiment in which three sensors 60 are arranged for use in a typical three-phase configuration; however, the present invention is not limited to this configuration but may be applied to other configurations, such as one, two or four phase circuit breakers. Sensor 60 is located at each phase or conductor 80. By having a similar sensor 60 on each phase, three-phase or single-phase faults can be detected. Reed switches 100 may be connected in parallel when there are multiple conductors 80.

Referring to FIGS. 1–5, power distribution system 10 operates in the following manner. Current flows from source 20 through power distribution system 10 to loads 22, 24, 26, 28, and 30. When current is flowing during quiescent (non-fault) conditions, the magnetic flux induced in core 84 of each sensor 60 is not enough to connect end 102 with end 104 of reed switch 100. Because end 102 does not connect with end 104, reed switch 100 remains in an open position. When an overcurrent condition occurs in any line, electronic trip unit 34 will receive a signal from sensor 60 in that line allowing electronic trip unit 34 to detect the location of the fault and determine the appropriate trip time based on the location of the fault. Adjusting gaps 96 in sensor 60 changes the amount of current that can flow through sensors 60 before sensors 60 provide a signal to electronic trip unit 34. By increasing gaps 96, sensor 60 provides a signal at a higher current through conductor 80. By decreasing gaps 96, sensor 60 provides a signal at a lower current through conductor 80.

In a first example, when an overcurrent condition occurs at a line 44, which is downstream from one downstream circuit breaker 40, current flowing through conductor 80 causes core 84 to saturate and generate a sufficient magnetic field to cause end 102 to push up against end 104 and close reed switch 100. When reed switch 100 is in the closed position, reed switch 100 provides a signal along direct cable link 62, or other communication link as described above, to electronic trip unit 34, which initializes microprocessor 36. Based on link 62 upon which electronic trip unit 34 receives the signal, microprocessor 36 chooses a longer trip time, i.e., first trip time 74, to allow the downstream circuit breaker time to trip and isolate the fault condition. Thus, current continues to flow through upstream circuit breaker 32 and selectivity is achieved.

In a second example, when multiple faults cause overcurrent conditions at multiple downstream lines 42, 44, and 50, a plurality of sensors 60 send signals to electronic trip unit 34. Microprocessor 36 determines that the signals are from a plurality of sensors 60 and, in response, chooses a shorter trip time, i.e., second trip time 76. In this example, microprocessor 36 chooses the shorter trip time to trip circuit breaker 32 more quickly since lines 38 may not be able to handle the multiple-fault overcurrent condition.

In a third example, when an overcurrent condition occurs at line 38, sensor 60 sends a signal to electronic trip unit 34. Based on line 62 upon which electronic trip unit 34 receives the signal, microprocessor 36 chooses the shorter trip time, i.e., second trip time 76. The shorter trip time causes circuit breaker 32 to trip quickly.

By having circuit breaker 32, which includes an electronic trip unit 34, upstream in power distribution system 10 and capable of receiving input from sensors 60, the location of a fault can be determined and power distribution system 10 becomes selective. In addition, sensors 60 can be used with downstream circuit breakers 40 that do not contain an electronic trip units. By eliminating the electronic trip unit in downstream circuit breakers 40, the cost of power distribution system 10 is significantly reduced over prior art distribution systems. In addition, sensors 60 are easy to install on existing conductors.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A sensor for a power distribution system having an electronic trip unit positioned upstream from the sensor, in the same branch, upstream from a plurality of the sensors in different branches, or a combination of both sensor arrangements, the sensor comprising:
   a conductor;
   a core proximate said conductor; and
   a reed switch adjacent said core, said reed switch in electrical communication with the upstream electronic trip unit.

2. The sensor of claim 1, wherein said core includes a main body portion and a removable portion.

3. The sensor of claim 2, further comprising an adjustable gap located between said main body portion and said removable portion.

4. The sensor of claim 3, wherein said gap includes a plurality of gaps.

5. The sensor of claim 1, wherein said core is a ferrous material.

6. The sensor of claim 1, wherein said sensor is connected in parallel with a second sensor.

7. The sensor of claim 6, wherein said second sensor is connected in parallel with a third sensor.

8. A power distribution system comprising:
   an upstream circuit breaker including an electronic trip unit;
   a downstream circuit breaker in electrical communication with said upstream circuit breaker;
   a first sensor positioned downstream from and in the same branch as said downstream circuit breaker, said first sensor comprising:
      a conductor in electrical communication with said downstream circuit breaker;

a core located proximate said conductor; and a reed switch adjacent said core, said reed switch in electrical communication with said upstream electronic trip unit.

9. The system of claim 8, wherein said core includes a main body portion and a removable portion.

10. The system of claim 9, further comprising an adjustable gap located between said main body portion and said removable portion.

11. The system of claim 10, wherein said gap includes a plurality of gaps.

12. The system of claim 8, wherein said core is a ferrous material.

13. The system of claim 8, further comprising a second sensor positioned downstream from and in the same branch as said upstream circuit breaker, said second sensor in electrical communication with said upstream electronic trip unit.

14. The system of claim 13, wherein said electronic trip unit includes a microprocessor.

15. The system of claim 14, wherein said microprocessor chooses a first trip time when said microprocessor receives a signal from said first sensor.

16. The system of claim 15, wherein said microprocessor chooses a second trip time when said microprocessor receives a signal from said second sensor.

17. The system of claim 16, wherein said first trip time is greater than said second trip time.

18. A power distribution system comprising:

an upstream circuit breaker including an electronic trip unit;

a downstream circuit breaker in electrical communication with said upstream circuit breaker, said downstream circuit breaker does not include an electronic trip unit;

a first sensor positioned downstream of and in the same branch as said downstream circuit breaker, said first sensor comprising:

a conductor in electrical communication with said upstream circuit breaker and said downstream circuit breaker;

a core located proximate said conductor; and a reed switch adjacent said core, said reed switch in electrical communication with said upstream electronic trip unit.

19. The system of claim 18, further comprising a second sensor positioned downstream from and in the same branch as said upstream circuit breaker, said second sensor in electrical communication with said upstream electronic trip unit.

20. The system of claim 19, wherein said electronic trip unit includes a microprocessor.

21. The system of claim 20, wherein said microprocessor chooses a first trip time when said microprocessor receives a signal from said first sensor.

22. The system of claim 21, wherein said microprocessor chooses a second trip time when said microprocessor receives a signal from said second sensor.

23. The system of claim 22, wherein said first trip time is greater than said second trip time.

24. A method of selective interruption of a power distribution system having an upstream circuit breaker and a downstream circuit breaker, said method comprising:

receiving a signal from at least one sensor located between said upstream circuit breaker and an electrical fault condition;

identifying a location of said at least one sensor;

selecting a trip time based on said location; and determining whether to trip said upstream circuit breaker based on said trip time;

wherein said trip time associated with a plurality of sensor signals is shorter than said trip time associated with a single sensor signal.

25. The method of claim 24, further comprising adjusting said sensor to send said signal at a predetermined current.

* * * * *